United States Patent
Kaczynski

(10) Patent No.: US 7,065,155 B2
(45) Date of Patent: Jun. 20, 2006

(54) METHOD AND APPARATUS FOR A TRANSCEIVER HAVING A CONSTANT POWER OUTPUT

(75) Inventor: Brian J. Kaczynski, Los Altos, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 758 days.

(21) Appl. No.: 09/927,425

(22) Filed: Aug. 10, 2001

(65) Prior Publication Data
US 2002/0080890 A1    Jun. 27, 2002

Related U.S. Application Data

(60) Provisional application No. 60/258,150, filed on Dec. 22, 2000.

(51) Int. Cl.
H04K 1/02   (2006.01)
H04L 25/03  (2006.01)
H04L 25/49  (2006.01)

(52) U.S. Cl. .................. 375/297; 375/318; 455/127.3; 455/311; 455/341

(58) Field of Classification Search ................ 375/297, 375/318; 455/127.3, 311, 341
See application file for complete search history.

(56) References Cited

U.S. PATENT DOCUMENTS

| 4,520,324 | A | * | 5/1985 | Jett et al. ..................... 330/285 |
| 4,851,842 | A |   | 7/1989 | Iwamatsu |
| 5,191,300 | A |   | 3/1993 | Graham et al. ............. 330/310 |
| 5,313,172 | A | * | 5/1994 | Vagher ........................ 330/254 |
| 5,564,087 | A |   | 10/1996 | Cygan et al. ............... 455/126 |
| 5,752,171 | A |   | 5/1998 | Akiya ......................... 455/126 |
| 5,867,778 | A | * | 2/1999 | Khoury et al. .............. 455/321 |
| 5,880,631 | A | * | 3/1999 | Sahota ........................ 330/51 |
| 6,046,640 | A | * | 4/2000 | Brunner ...................... 330/254 |
| 6,069,579 | A |   | 5/2000 | Ito et al. ..................... 341/156 |
| 6,154,018 | A | * | 11/2000 | Sessions ..................... 323/315 |
| 6,201,443 | B1 | * | 3/2001 | Tanji .......................... 330/254 |
| 6,463,295 | B1 | * | 10/2002 | Yun ............................ 455/522 |
| 6,504,433 | B1 |   | 1/2003 | Weber et al. |

FOREIGN PATENT DOCUMENTS

| EP | 0616421  | 2/1994 |
| EP | 0 718 985 | 6/1996 |
| EP | 0 847 147 | 6/1998 |
| GB | 2 326 782 | 12/1998 |

OTHER PUBLICATIONS

PCT Written Opinion, Mar. 18, 2004, PCT/US01/48871.
Cho et al.: "A Single-Chip 900 MHz Spread Spectrum Digital Cordless Phones", IEEE Int. Solid State Cir. Conf., IEEE Int. Sol. State Cir. Conf., (1999).
Rofougaran, A et al.: A Single-Chip 900 Mhz Spread Spectrum Wireless Transceiver In 1 -μm CMOS-PartI: Architecture and Transmitter Design, IEEE J. of Sol. State Circuits, $3^{rd}$ ed., vol. 33 (No. 4), pp. 515-534, (1998).

* cited by examiner

Primary Examiner—Kevin Burd
Assistant Examiner—Juan Alberto Torres
(74) Attorney, Agent, or Firm—Bever, Hoffman & Harms, LLP; Jeanette S. Harms

(57) ABSTRACT

The present invention includes a transceiver and a method of operating the same that includes in the transmitter a power control circuit that operates on an analog differential signal containing data packets individually. The power control circuit initially transmits a series of data symbols with known values, periodically strobes the transceiver system for correct power levels and incrementally increases the power level of the transceiver until the optimal gain is reached, without exceeding the maximum output power.

12 Claims, 4 Drawing Sheets

METHOD AND APPARATUS FOR A TRANSCEIVER HAVING A CONSTANT POWER OUTPUT

This application is related to and claims priority to U.S. Provisional Application No. 60/258,150 filed on Dec. 22, 2000.

FIELD OF THE INVENTION

The present invention is generally related to a complementary metal oxide semiconductor (CMOS) transceiver. More specifically, the present invention relates to a method and apparatus for achieving constant output power from a CMOS transceiver.

BACKGROUND OF THE RELATED ART

A transceiver is a well-known circuit, containing a transmitter and a receiver, which are thus capable of transmitting and receiving communication signals, respectively. Conventionally, the transmitter contains a power amplifier (PA) that provides the last stage of amplification of the signal to be transmitted.

In most conventional designs, the power amplifier is implemented as a component that is physically separate from other parts of the transmitter and/or transceiver. Also, power amplifier's made from gallium arsenide (GaAs) or Silicon bipolar junction transistors (SiBJT) are typically used because they have an inherently higher breakdown voltage than transistors made in a CMOS circuit, whether the transistors are n-channel or p-channel transistors. While such designs allow for a power amplifier that has the desired amplification characteristics, they do so at the expense of cost. Not only is a GaAs, SiBJT or other non-CMOS power amplifier costlier than a transistor in a CMOS integrated circuit, but the non-CMOS power amplifier cannot be formed on the same integrated circuit chip as the components of the transmitter and/or transceiver. Both of these factors add to the overall cost of the resulting transceiver.

It has been recognized that it would be beneficial to have a transceiver in which most of the transmitter and receiver circuits are on a single chip, including the power amplifier. For example, in the article entitled *A Single Chip CMOS Direct-Conversion Transceiver for 900 MHz Spread Spectrum Digital Cordless Phones* by T. Cho et al. that was presented at the 1999 IEEE International Solid State Circuits Conference, there is described a CMOS transceiver chip that includes an integrated power amplifier. An improved CMOS power amplifier is also described in the application entitled CMOS TRANSCEIVER HAVING AN INTEGRATED POWER AMPLIFIER, bearing application Ser. No. 09/663,101, filed on Sep. 15, 2000 and assigned to the same assignee as the assignee of the invention described herein, which recognizes the advantage of integrating the power amplifier.

Nevertheless, a major disadvantage of CMOS power amplifiers is that they exhibit a wide range of power levels variation due to their sensitivity to thermal and process variations. High efficiency and constant power levels in CMOS power amplifiers is impeded by the technologies low breakdown voltage, low current drive, and lossy substrate.

Furthermore, conventional transmitter designs operate so that the output power is transmitted based upon a function of many different variables, in a Code Division Multiple Access (CDMA) environment, for example, the power output of a mobile transmitter will typically be based upon the distance between the mobile transmitter and the base station currently in use. In such an environment, the output power will increase, for example, if the mobile transmitter travels closer to the base station. In operation, the gain of a variable gain amplifier that is part of the transmitter, at either the intermediate frequency (IF) or radio frequency (RF) stage, will be changed to thereby lower the transmit output power. In this situation, while the output power may become too large for a period of time, that is acceptable within the overall system requirements.

In other environments, however, it is required, by for instance the Federal Communication Commission (FCC), that the output power must not exceed a pre-specified level at any time. In such an environment, the above-described design cannot be used. Since in order to take into account instances in which power will exceed the pre-specified maximum, the average output power must be much lower than that maximum, which degrades system performance to an unacceptable level.

Accordingly, a transmitter containing a variable gain amplifier and a power amplifier integrated with a CMOS transceiver chip that overcomes the above disadvantage would be desirable.

SUMMARY OF THE INVENTION

It is an object of the present invention to provide a transmitter on an integrated CMOS transceiver chip that provides a substantially constant power output.

It is another object of the invention to provide an apparatus and method that allows for gradual step increases in output power to avoid the output power from exceeding a predetermined maximum output power.

It is still another object of the present invention to provide a method of operating a variable gain amplifier using the sensed output power to determine whether to back-off from the current output power.

It is a further object of the present invention to provide a variable gain amplifier including a folded cascode stage and/or a mirroring array of unit gain cells.

The above objects of the present invention, among others, either alone or in combination are achieved with a transceiver and a method of operating the same that includes in the transmitter a power control circuit that operates on an analog differential signal containing data packets individually. The power control circuit initially transmits a series of data symbols within each packet with known deterministic values, periodically strobes the transceiver system for correct power levels and incrementally increases the power level of the transceiver until the optimal gain is reached, without exceeding the maximum output power.

More specifically, the power control circuit receives signals indicating the output power that are obtained from a power detector and comparator combination, and based upon the level of the received signals will accordingly adjust the variable gain amplifiers. During initial operation, the gain of the variable gain amplifier will be set to a predetermined, preferably user-configurable, initial gain when transmitting the first symbol in the first transmitted packet. After an appropriate wait time to ensure that the variable gain amplifiers stabilize, and a correspondingly accurate output power is achieved, the power control circuit strobes the comparator to receive a signal indicating the output power while that symbol is being transmitted. If the output power, and therefore the gain, is too low, the power control circuit will repeatedly increment the gain in order to reach but not exceed the predetermined maximum output power.

Once achieved, output power is prevented from exceeding the predetermined maximum by decreasing the gain by a predetermined amount at the beginning of transmission of each subsequent packet, so that the output power can be lowered by an amount corresponding to the decreased gain on a per-packet basis. Alternatively, the comparator can be strobed during the training sequence of symbols within each packet at the results of the comparison used to back-off the output power by at least one or maybe more steps during the transmission of the next packet.

The variable gain amplifier implemented allows for the power control circuit to change the gain in small incremental steps, thereby allowing the power control algorithm implemented by the power control circuit to operate.

BRIEF DESCRIPTION OF THE DRAWINGS

The above, and other objects, features, and advantages of the present invention are further described in the detailed description which follows, with reference to the drawings by way of non-limiting exemplary embodiments of the present invention, wherein like reference numerals represent similar parts of the present invention throughout several views and wherein.

DETAILED DESCRIPTION OF THE PREFERRED EMBODIMENTS

Reference will now be made in detail to preferred embodiments of the invention, examples of which are illustrated in the accompanying drawings. Wherever convenient, the same reference numbers will be used throughout the drawings to refer to the same or like parts.

Other embodiments will be apparent to those skilled in the art from consideration of the specification and practice of the invention disclosed herein. It is intended that the specification and examples be considered as exemplary only, with a true scope of the invention being indicated by the following claims and equivalents.

Figure 1:
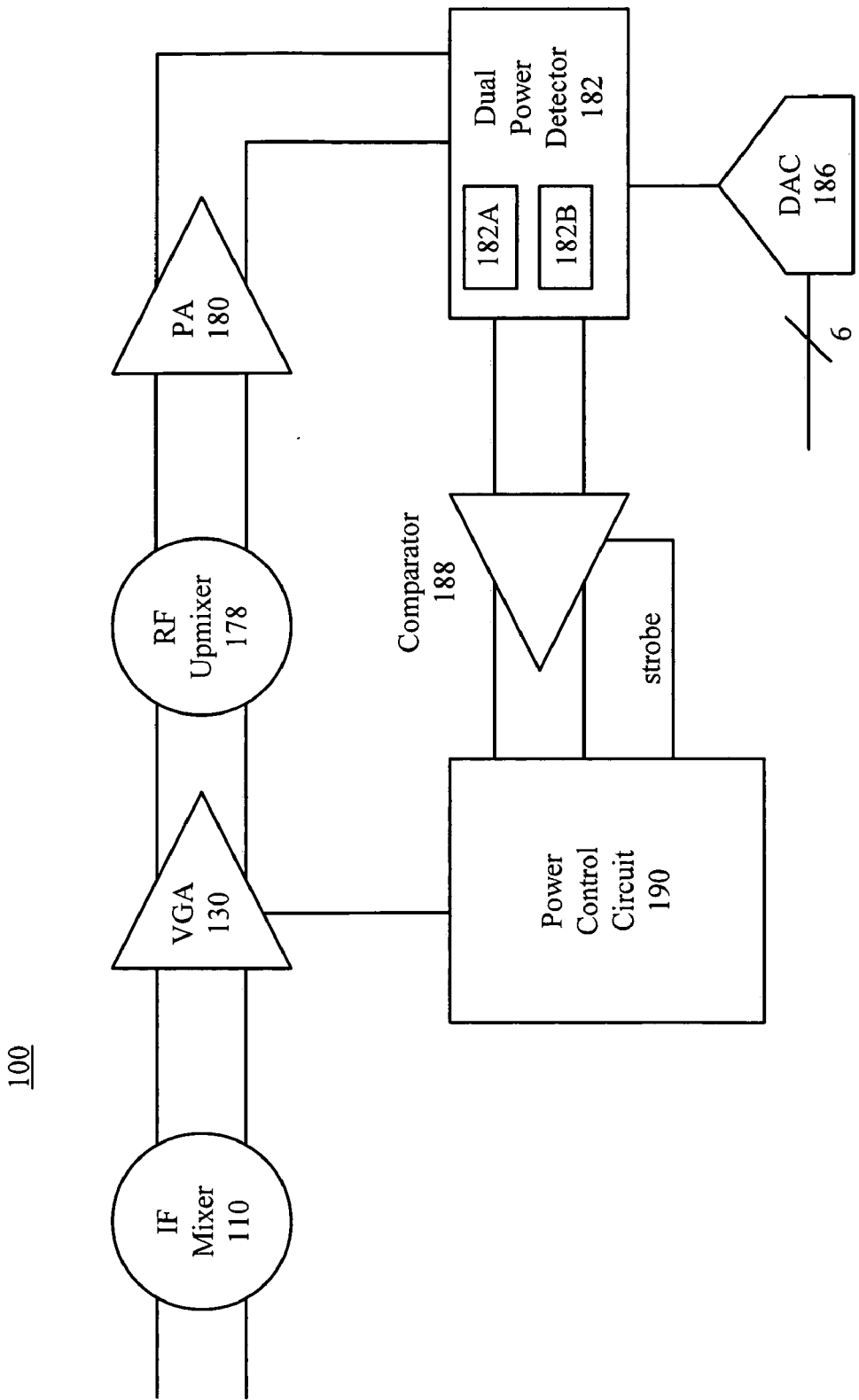
FIG. 1 illustrates a block diagram of an embodiment of the power control circuitry according to the present invention.

FIG. 1 illustrates a block diagram of an embodiment of a power control circuit 100. As shown in FIG. 1, IF upmixer 110 upconverts signals received by the transceiver to an IF frequency as is known, for example a 1 GigaHertz IF Frequency and a 5 GigaHertz RF frequency. After the IF upmixer 110, the IF variable gain amplifier (VGA) 130 which, in the preferred embodiment contains a 5 bit input control input and is configurable from 0 dB to 15.5 dB in steps of 0.5 dB, amplifies the IF signal. The amplified IF signal is then transmitted to an RF upmixer 178, which upconverts the IF signal to an RF signal.

The gain of the variable gain amplifier 130 is based on several factors such as the die temperature and device process corner.

The output from RF upmixer 178 is then supplied to the power amplifier 180, which amplifies the signal to be transmitted. To sense the power of the transmitted signal, a power detector is employed. In the preferred embodiment, a dual matched power detector 182 is used as shown in FIG. 1. One of the power detectors 182A is used to detect the transmitted signal, obtained from the radio frequency (RF) signal at the drain of the power amplifier 180, while the other power detector 182B is used to detect the reference signal. The reference signal is generated using a predetermined digital value that is used to create an analog signal of appropriate level using a digital to analog converter 186, as shown. Each of the power detectors 182 is essentially a source follower circuit biased at very low currents (200 nA) with large capacitive loads (4 pF). The outputs of the two matched power detectors are compared, and optimal power is reached when the power detector outputs match. The use of matched power detectors made from the same process results in an optimal power that is as independent of temperature and process as is possible.

The outputs from each of the power detectors 182A and 182B are supplied to a comparator 188, which is strobed at appropriate intervals, described hereinafter, and the difference between the transmitted signal and the reference signal obtained from the comparator 188 is input to power control circuit 190. As described further hereinafter with respect to FIG. 2, the power control circuit 190 is used to achieve and maintain a steady state operation, such that on a packet-to-packet basis the gain settings of the variable gain amplifier 130 desirably results in a substantially constant output power. While the variable gain amplifier 130 is described hereinafter as a single gain stage containing numerous gain cells, it is noted that a number of variable gain amplifiers, in both IF and RF transmitter portions, could instead be used, with the composite gain then being determined and used by the power control circuit 190 as described herein.

The power control circuit 190 is preferably implemented as a finite state machine executing the power control algorithm as described herein, which is preferably a hardware-based logic. Using such a power control circuit 190 allows operation at a power level which is close to but will not exceed the maximum output power that can be transmitted for any given packet by the system and still be within the FCC power requirements.

Each of the components described above is preferably made on the same integrated circuit chip. Also, while the output power detection circuitry is described as being implemented with power detectors 182A and 182B, digital to analog converter 186, and the comparator 188, other types of circuit elements can be used to detect the output power.

Figure 2:
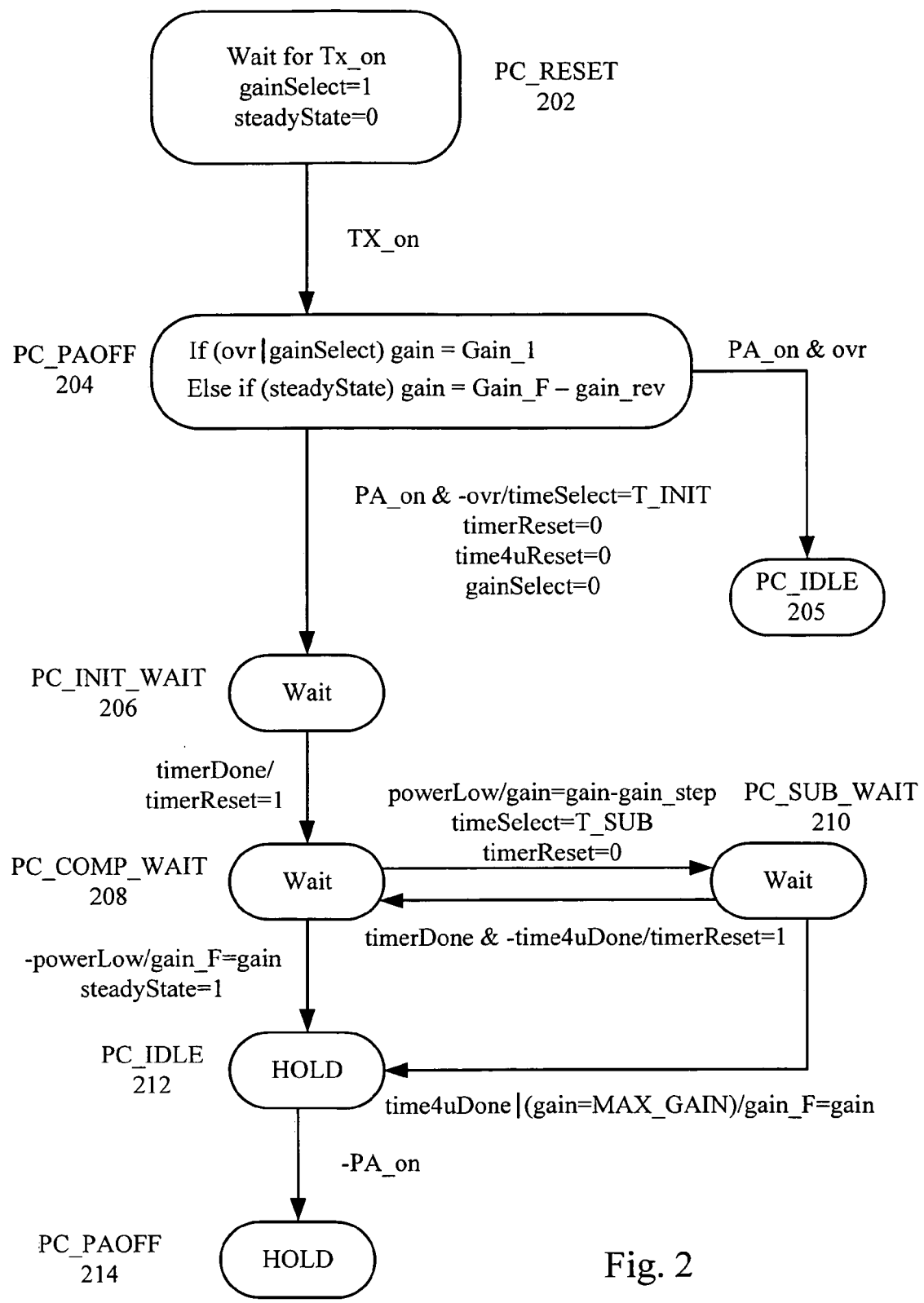
FIG. 2 illustrates a state diagram of the power control algorithm according to the present invention.

FIG. 2 illustrates a state diagram of the power control algorithm according to the present invention, which will be used to describe the operation of the gain control process in more detail.

After a reset signal is received by the power control circuit 190, in step 202, the power control circuit 190 waits for TX_on signal indicating that a transmission is to begin. At this time a gainSelect flag is set to "1" indicating that a default initial gain value will be used and a steadyState flag is set to "0" indicating that steady state operation has not yet been achieved.

Once the TX_on signal is received indicating that transmission is desired, step 204 follows, in which a determination is made whether a circuit override operation is desired, which will typically occur during burn-in testing. In this case, the gainSelect flag is maintained at the "1" state, thus indicating that a preset burn-in gain value should be used. Accordingly, step 205 will follow if the override operation takes place, and the burn in gain will be applied to the upmixer 110 and the variable gain amplifier 130 once the power amplifier 180 is on until the burn-in test operation is complete.

If, however, in step 204 a normal operation mode occurs, then gainSelect flag will be set to "0", and the gain used will set the variable gain amplifier 130 to a normal mode operation initial gain value. In this stare, the first few data symbols, such as the first eight, that are transmitted will preferably have known, deterministic initial values, thus allowing the power control circuit to achieve a steady state condition more accurately. In a preferred embodiment, gain control is only performed on some initial number of the first few data symbols, such as 5, so that the remaining symbols having deterministic values can be used for automatic gain control (AGC) in the receiver which is receiving the transmitted signal. Further, in the preferred embodiment, each symbol is 0.8 µs long, such that if gain changes occur during the first 5 symbols this provides 4 µs for obtaining the appropriate gain, and each packet is about 1 ms in duration.

Once the gain setting for the VGA 130 is obtained and the power amplifier 180 becomes turned on, then the normal mode operation initial gain value will be used to initially operate the variable gain amplifier 130 for the remainder of the packet transmission. An initial wait step 206 then follows, and allows the system to settle at this initial gain value The initial wait time can be predetermined, but will typically be longer than the wait time that is used between gain steps as described hereinafter.

After that initial wait time, the power control circuit 190 enters into its normal mode loop that is used to reach an appropriate steady state gain. In step 208, the output power is checked by strobing the comparator 188, and if it is low is adjusted by increasing the gain by a gain step.

In the preferred embodiment, the gain may be increased in 0.5 dB increments, although in early steps if the gain is lower than the desired gain by some predetermined threshold, steps as large as 2.0 dB can be initially used. No matter what gain steps are used, however, an important aspect of the present invention is that an individual gain step will not cause the overall power of the transmitted signal to exceed a predetermined maximum value, which value will typically correspond to FCC regulations, as noted above. Also during stop 208, the next wait interval is set which again can be up to 2 µn 62.5 ns steps in the preferred embodiment.

Steps 208 and 210 represent the core of the power control algorithm. In step 208, the power control comparator is strobed, and it is determined whether or not the output power is too low. If the power is too low, the algorithm increases the gain setting by one increment, and proceeds to step 210, the post-gain-change wait period. Steps 208 and 210 subsequently repeat, with the gain increasing, until either (1) the time duration allocated for changing the gain expires or (2) the optimal output power is reached. When either of the two aforementioned conditions is met, the algorithm enters the hold state 212 and the existing gain setting is held for the duration of the packet.

If condition (1) is met, meaning that the optimal output power was not reached, then the remainder of the packet will be transmitted at the then current gain setting until data corresponding to the next packet is ready for transmission. At the end of the transmission time of that packet, the power amplifier 180 is turned off until the next packet is ready to be transmitted. At the time for transmission of the next packet the algorithm enters step 204 and the gain setting reached in the previous packet will be used as the initial gain setting for the new current packet. When the next packet is to be transmitted, the gainSelect flag, which had been set to "1," is set to "0" indicating that the default initial gain value will not be used, but that the initial gain value will be the last gain value from the previous packet. This packet-to-packet cycle of increasing the power will repeat until the optimal power is reached. When the optimal power is reached, the steadyState flag is set to "1", enabling the power control circuit 190 to reduce the power if necessary, as described below.

Once the optimal gain setting is reached, the present invention also includes a mechanism for reducing the gain setting if operating conditions so require, such as if a temperature variation causes an increase in output power. To accomplish this, during the PA-OFF state 204, at the beginning of each packet following an "optimal-power" packet, the gain will be reduced by a user-configurable amount, such as 2 dB, and will be allowed to either (1) recover the same gain setting through the process of increasing the gain described above, or (2) will settle to a lower gain setting if operating conditions so require. In either case (1) or (2) above, the system should recover the same output power. Since the power is already very close to optimal, this method ensures that the output power will be within a user configurable step of the target output power. Alternatively, the comparator can be strobed during the training sequence of symbols within each packet at the results of the comparison used to back-off the output power by at least one or maybe more steps during the transmission of the next packet.

Having described the operation of the power control circuit 100, a further discussion will be provided relating to certain of the circuits used in the power control circuit 100.

Figure 3:
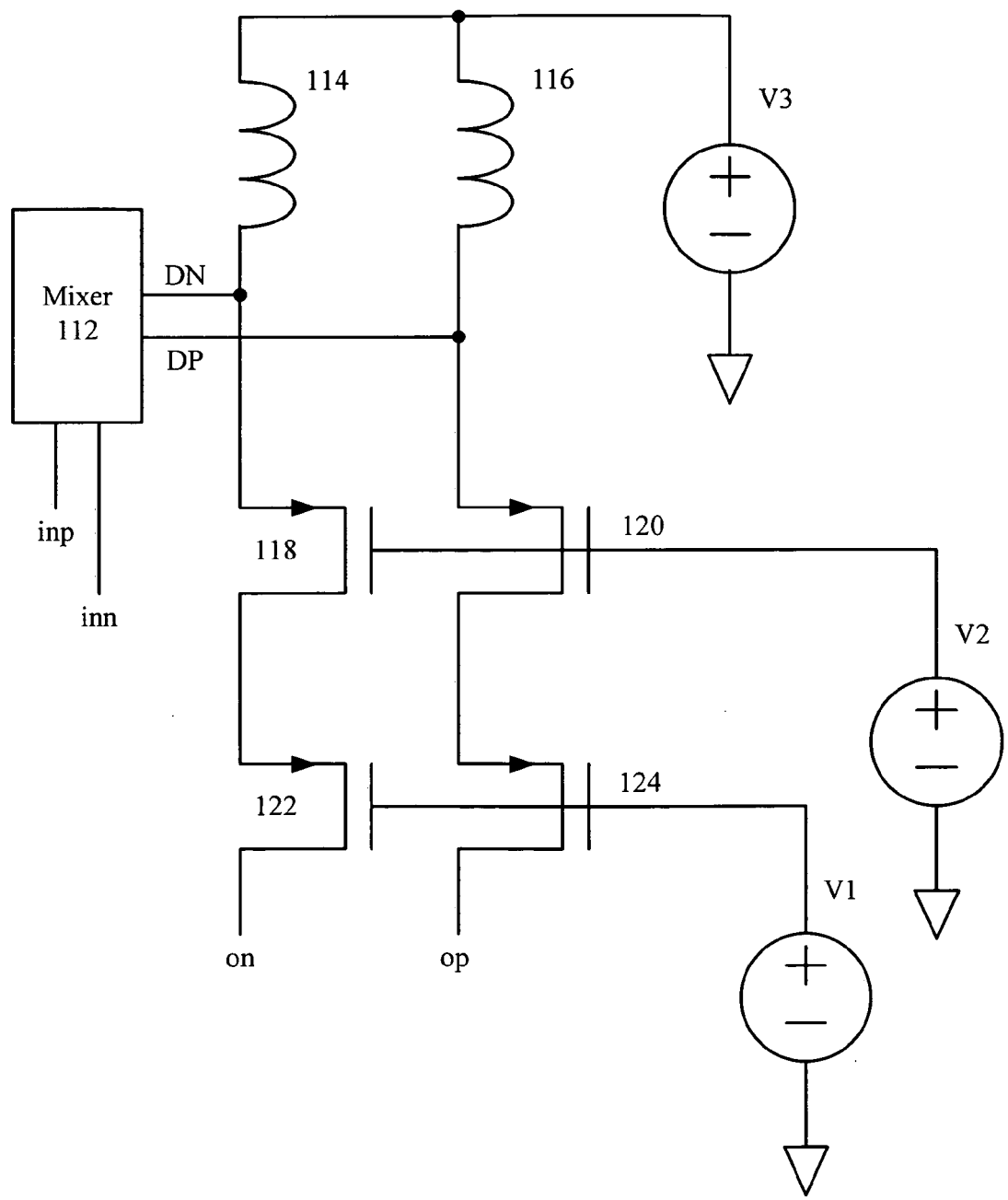
FIG. 3 shows the inductively-loaded folded-cascode level-shift stage between the upmixer and the intermediate frequency variable gain amplifier of the power control circuit according to the present invention.

FIG. 3 shows the inductively-loaded folded-cascode level-shift stage between the upmixer 110 and the variable gain amplifier 130 in mare detail. The IF upmixer 110, which will either rake the baseband signal to en IF level as described in the preferred embodiment, as well as the RF upmixer 178, which will take the IF signal to an RF level, can be formed using conventional techniques. The present invention provides, however, an inductively tuned level-shift stage at the output of the IF mixer 110. The differential output signal, shown as DP (positive) 115 and DN (negative) 113, that is output from the mixer 112, is transmitted through an inductively loaded folded cascade circuit. P-type metal-oxide-semiconductor (PMOS) transistors 118 and 120, with each gate thereof biased at a DC bias that will result in a fixed, predetermined DC drain current flowing through the PMOS transistors 122 and 124, complete the level-shift circuit at the output of mixer 110. The purpose of the level-shift block is to convert the Voltage Drain-Drain (VDD)-referenced driver output of the upmixer circuit 110 to a ground-referenced signal suitable for driving an n-type metal-oxide-semiconductor (NMOS) current mirror, as well as to convert the differential outputs of the upmixer circuit 110 into low-impedance (current-mode) nodes, thereby making the upmixer circuit less sensitive to the quality factor (Q) of the tuned output load. Put another way, the level-shift block with the PMOS common gate stage operates as a folded-cascode stage with unity current gain, redirecting AC current from the upmixer circuit 110 to ground.

Figure 4:
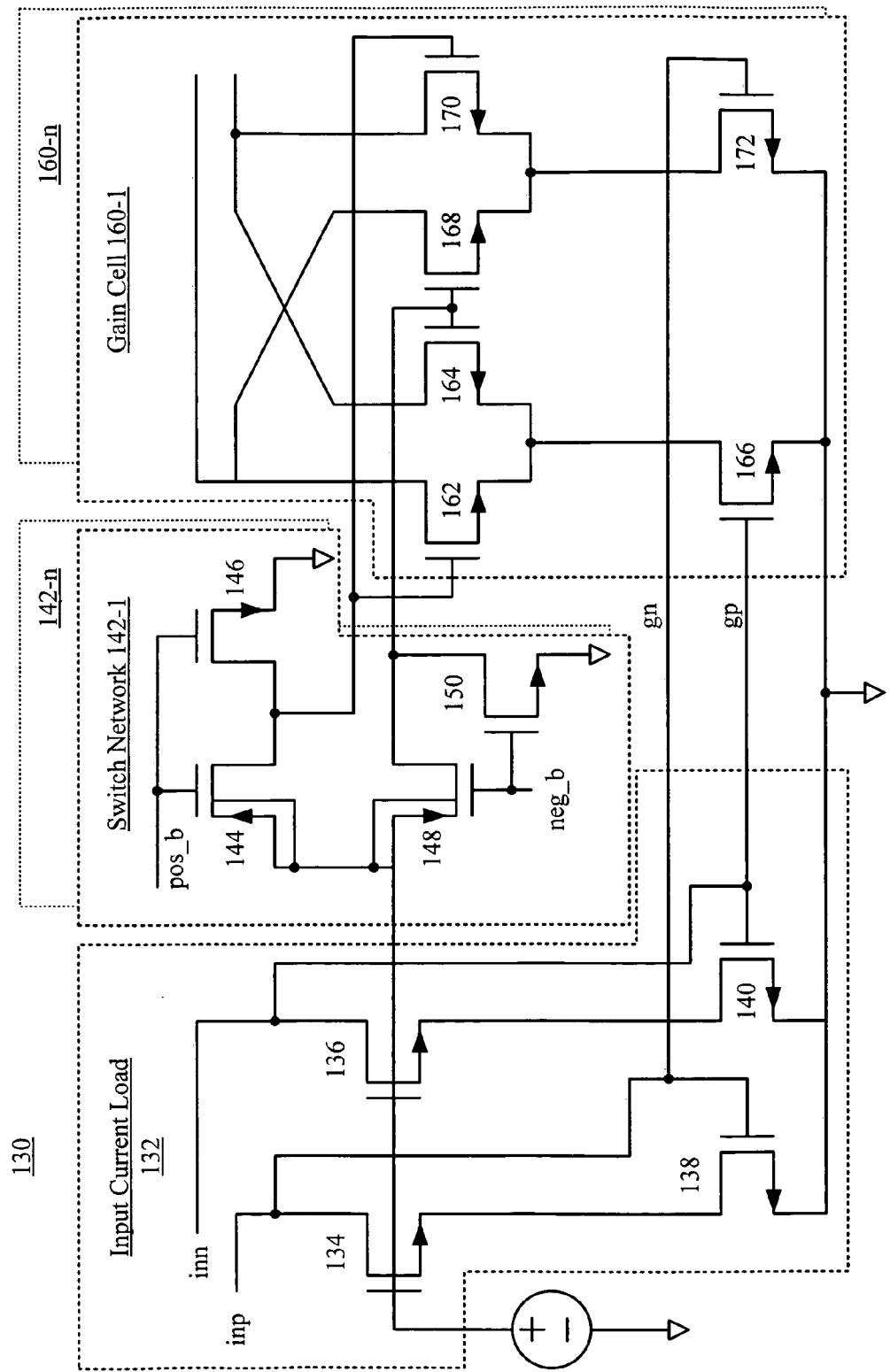
FIG. 4 illustrates the variable gain amplifier of the power control circuit according to the present invention.

FIG. 4 illustrates the variable gain amplifier 130 of the power control circuit 100 in more detail. Initially, certain of the blocks that make up the variable gain amplifier 130 will be described. The variable gain amplifier includes an input current load block 132, a plurality of switch network blocks 142-1 to 142-*n*, and a corresponding plurality of gain cells 160-1 to 160-*n*. The gain cells 160 are each replicated, as described hereinafter, to allow the step increments in the gain, as mentioned above and described more fully below.

The input current load block 132 of FIG. 4 will first be described in more detail, and contains NMOS transistors 134, 163, 138 and 140, with the gates of NMOS transistors 134 and 136 being biased by the first DC voltage and which together function as cascode transistors for the current mirror transistor 138 and 140. The gate of each of transistors 138 and 140, and the drain of each of transistors 134 and 135, respectively receive the INP and INN input signals, which are output from the input current load block as signals gn and gp, as shown.

The switch network 142 of FIG. 4 will next be described in more detail and contains PMOS transistors 144 and 148, and NMOS transistors 145, and 150. Transistors 144 and 146 operate as a pair and are used to switch the cascade voltage at the gates of transistors 134 and 136 to the outer pair of transistors 162 and 170 of the gain cell block 160, as described further hereinafter, whereas transistors 148 and 150 operate as a pair and are used to switch the cascade voltage at the gates of transistors 134 and 136 to the inner pair of transistors 164 and 168 of the gain cell 160. Each of transistors 144 and 146 are switched based upon the pos b input signal, whereas each of transistors 148 and 150 are switched based upon the neg b input signal. In operation, either one of pos b or neg b may be on at the same time, but both will nor be on at the same time. It is also noted that PMOS transistors 144 and 148 have their bulk node tied to their source nodes providing lower on-resistance, which improves their switch characteristics, and that the size of the transistors 144, 146, 148 and 150 is fixed, and not related to the size of any other deices, unlike the transistors in the input current load block 132 and gain cell 160, which are chosen to mirror each other, as described further herein.

Each gain cell 160, such as the gain cell 160-1 of FIG. 4, is essentially an NMOS current minor, formed of transistors 162–172. Before further describing a gain cell 160, it is noted that the current outputs from the gain cell 160 mirror the current inputs and inn presented to the input current load block 132. The sizing of the transistors 162,164,168 and 170 thus mirror the size of the transistors 134–140 from the input current load block 132.

With transistor 166 having its gate controlled by the gp signal, and transistor 172 having its gate controlled by the gn signal, and possibly either transistors 162 and 170, or 164 and 168 turned on, depending upon the state of the pos b and neg b signals, each gain cell is provided with two gain settings: a positive polarity setting and a negative polarity setting. In the positive gain setting, current from transistors 166 and 172 flows through transistors 162 and 170, respectively, in a conventional current mirror configuration. In the negative gain setting, the drain outputs of the current mirrors are reversed, and current from transistors 166 and 172 flows through transistors 164 and 168, respectively, resulting in a current mirror cell with the same AC gain, but opposite polarity.

In operation, as noted, multiple ones of the gain cells 160 in the variable gain amplifier 130 will be connected in parallel such that two signals, gn and gp, drive the common gn and gp input of all of the gain cells, and two outputs, OUTN and OUTP, will be driven by the common OUTN and OUTP outputs of all of the gain cells. This type of parallel connection of multiple gain cells allows for small incremental gain steps. In operation, there should always be more "positively-connected" gain cells than "negatively-connected" gain cells, resulting in an overall positive configuration.

Within the variable gain amplifier 130, a single one of the gain cells 160 (i.e. "fine adjust cell") can be both "positively-connected" and "negatively-connected," thereby allowing it to be placed in a neutral gain configuration and allowing for fine adjustments to be made by simply turning this fine adjust cell on or off, and effectively allowing the gain increment to be half of what it would be without this fine adjust cell 160. Thus, for example, if gains are stepped through at 0.5 dB, 1.0 dB, 1.5 dB, 2.0 dB, 2.5 dB, and 3.0 dB, the fine adjust cell will change state several times. It should also be noted that each of the various pos b and neg b signals is controlled by the power control circuit, which, as described, operates digitally. Accordingly, it will be appreciated that the relative size of each gain step can be precisely controlled, since each gain step may be a combination of both positively connected gain cells and negatively connected gain cells.

While the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the spirit and scope of the invention.

What is claimed is:

1. An apparatus for use in a transmitter comprising:
    a variable gain amplifier, the variable gain amplifier including:
    an inductively loaded folded cascode circuit that inputs an input differential signal having a Voltage Drain-Drain (VDD)-referenced output level and outputs a current;
    an input current load circuit that inputs the current from the inductively-loaded folded cascode circuit and outputs an output differential signal having a ground-referenced output level;
    a plurality of gain cells, each gain cell coupled to the input current load circuit and receiving the output differential signal, each gain cell comprising two current mirror circuits; and
    a plurality of switching circuits, each switching circuit coupled to one of the plurality of gain cells and each switching circuit operating in a positive mode and in a negative mode, the negative mode having an opposite polarity of the positive mode, and wherein the plurality of switching circuits operate to place more of the plurality of gain cells in the positive mode than in the negative mode.

2. The apparatus according to claim 1 wherein the positive mode and the negative mode occur at the same time in a gain cell of the variable gain amplifier, thereby providing for fine gain adjustments.

3. The apparatus according to claim 1 wherein the input current load circuit is comprised of four n-type metal-oxide-semiconductor (NMOS) transistors arranged in a cascade configuration.

4. The apparatus according to claim 3 wherein the input current load circuit is mirrored by each of the plurality of gain cells.

5. The apparatus according to claim 4 wherein each of the current mirror circuits in each of the plurality of gain cells comprises three NMOS transistors.

6. The apparatus according to claim 5 wherein each of the plurality of switching circuits includes an NMOS and a p-type metal-oxide-semiconductor (PMOS) transistor that operate to create the positive mode and an NMOS and a PMOS transistor that operate to create the negative mode.

7. The apparatus according to claim 1 wherein the input current load circuit is mirrored by each of the plurality of gain cells.

8. The apparatus according to claim 1 wherein each of the current mirror circuits in each of the plurality of gain cells comprises three NMOS transistors.

9. The apparatus according to claim 1 wherein each of the plurality of switching circuits includes an NMOS and a PMOS transistor that operate to create the positive mode and an NMOS and a PMOS transistor that operate to create the negative mode.

10. The apparatus according to claim 1 further comprising:
   an intermediate frequency upmixer having an intermediate frequency upmixer output coupled to an input of the variable gain amplifier; and
   a radio frequency upmixer having a radio frequency upmixer input to an output of the variable gain amplifier.

11. The apparatus according to claim 1 wherein the input current load circuit is commonly connected to each gain cell and the gain cells have inputs for receiving the output differential signal, the inputs of each gain cell being commonly connected to the output differential signal.

12. The apparatus according to claim 1 wherein the switching circuits operate to place a selected portion of the plurality of gain cells in the positive mode, the portion being selected to maintain a preferred output power level.

* * * * *